United States Patent [19]
Uyama

[11] Patent Number: 5,930,151
[45] Date of Patent: Jul. 27, 1999

[54] OPTIMUM PLACEMENT METHOD OF CIRCUIT BLOCKS IN SEMICONDUCTOR INTEGRATED CIRCUIT

[75] Inventor: Masaki Uyama, Tokyo, Japan

[73] Assignee: NEC Corporation, Tokyo, Japan

[21] Appl. No.: 08/868,531

[22] Filed: Jun. 4, 1997

[30] Foreign Application Priority Data

Jun. 4, 1996 [JP] Japan .................................. 8-141311

[51] Int. Cl.⁶ .................................................. G06F 17/50
[52] U.S. Cl. ............................................................ 364/491
[58] Field of Search ................................... 364/488, 489, 364/490, 491

[56] References Cited

U.S. PATENT DOCUMENTS

| | | | |
|---|---|---|---|
| 5,212,652 | 5/1993 | Agrawal et al. | 364/480 |
| 5,400,074 | 3/1995 | Agrawal et al. | 364/489 |
| 5,422,823 | 6/1995 | Agrawal et al. | 364/489 |
| 5,483,461 | 1/1996 | Lee et al. | 364/490 |
| 5,740,069 | 4/1998 | Agrawal et al. | 364/489 |
| 5,838,584 | 11/1998 | Kazarian | 364/491 |
| 5,838,585 | 11/1998 | Scepanovic et al. | 364/491 |

FOREIGN PATENT DOCUMENTS 3-196547  8/1991  Japan .

*Primary Examiner*—Vincent N. Trans
*Assistant Examiner*—Leigh Marie Garbowski
*Attorney, Agent, or Firm*—Foley & Lardner

[57] ABSTRACT

In an optimum placement method of circuit blocks in a semiconductor integrated circuit, from a given initial placement of circuit blocks, a new initial placement is prepared on the basis of connection information of the circuit blocks, by placing circuit blocks as many as possible, in the form of a single stream of circuit blocks in which each circuit block is connected to only an adjacent circuit block but is not connected to a not-adjacent circuit block. From the circuit blocks included in the new initial placement, there is found out a connection destination circuit block of a not-yet-placed circuit block which is not included in the new initial placement, and then, the not-yet-placed circuit block is inserted to a best position adjacent to the connection destination circuit block, thereby to temporarily determine the placement of all circuit blocks. Thereafter, only the circuit blocks in the proximity of the inserted circuit blocks is replaced to finally determine the best placement of all circuit blocks.

4 Claims, 8 Drawing Sheets

TOTAL WIRING LENGTH = 15

TOTAL WIRING LENGTH = 3

TOTAL WIRING LENGTH = 4

TOTAL WIRING LENGTH = 5

TOTAL WIRING LENGTH = 11

TOTAL WIRING LENGTH = 10

TOTAL WIRING LENGTH = 4

TOTAL WIRING LENGTH = 3

OPTIMUM PLACEMENT METHOD OF CIRCUIT BLOCKS IN SEMICONDUCTOR INTEGRATED CIRCUIT

BACKGROUND OF THE INVENTION

1. Field of the Invention

The present invention relates to a placement method in a semiconductor integrated circuit of a standard cell type or a gate array type, and more specifically to an optimum placement method in a semiconductor integrated circuit for automatically processing an optimum circuit block placement by use of a computer.

2. Description of Related Art

In the prior art, for example, Japanese Patent Application Pre-examination Publication No. JP-A-3-196547, an English abstract of which is available from the Japanese Patent Office and is incorporated by reference in its entirety into this application, proposes an optimum placement method in a semiconductor integrated circuit in order to minimize an area of the integrated circuit and a total wiring length when a placement and layout of circuit blocks are determined by an automatic placement processing using a computer.

Referring to FIG. 1, there is shown a flow chart illustrating one example of the prior art semiconductor integrated circuit placement method proposed by JP-A-3-196547. First, an initial placement is determined (Step S51), and the number of continuous operations of replacing and moving the circuit blocks is determined or set (Step S52). Next, a current placement stats is evaluated (Step S53), and the number of continuous replacing and moving operations of the circuit blocks is compared with a set value (Step S54). If the number of continuous replacing and moving operations is less than the set value, the processing goes into a Step S55 and succeeding steps, where a selection, replacement and movement of the blocks are conducted so that a new placement state is generated, and then, the new placement state is evaluated (Steps S55, S56 and S57). Furthermore, whether or not the new placement state is improved in comparison with the old placement state is discriminated, and if the new placement state is improved, the new placement state is registered, and the number of continuous replacing and moving operations of the circuit blocks made until that time is reset (Steps S58, S60 and S61). To the contrary, if the new placement state is not improved, the number of continuous replacing and moving operations of the circuit blocks is incremented by "1" (Step S59), and the operation of replacing and moving the circuit blocks is repeated.

This prior art semiconductor integrated circuit placement method will be specifically described with reference to FIGS. 2A, 2B, 2C and 2D.

FIG. 2A shows a given initial placement composed of seven circuit blocks 61, 62, 63, 64, 65, 66 and 67, which are interconnected through wiring conductors 7 as shown. Here, assume that the number of continuous replacing and moving operations of the circuit blocks is set to "2". In addition, assuming that a wiring length interconnecting between a pair of adjacent circuit blocks is "1", a total wiring length in the given initial placement becomes "15".

For the purpose of shortening the total wiring length, two circuit blocks 62 and 63 are replaced and moved as shown in FIG. 2B. In this case, however, the total wiring length becomes "17". At this time, since the number of continuous replacing and moving operations has not yet exceeded the set value of "2", two circuit blocks 64 and 65 are further replaced and moved as shown in FIG. 2C. In this case, however, the total wiring length becomes "18". Namely, since the total wiring length in the old or initial placement is "15", the placement state becomes deteriorated. At this time, since the number of continuous replacing and moving operations has exceeded the set value of "2", it is finally judged that the initial placement is the best placement.

As mentioned above, in the prior art method it is judged that the placement shown in FIG. 2A is the best placement. Actually, however, a placement shown in FIG. 2D is possible, and this is the best placement, since the total wiring length is "10".

As seen from the above, in the prior art method, the final placement state greatly depends upon the initial placement state. In addition, if the number of continuous replacing and moving operations is limited to a small value, an improvement processing ends before it reaches the best placement state, and the final placement state is apt to become a local minimum solution which minimizes the wiring length only locally. On the other hand, if the replacing and moving operations of the circuit blocks are continuously repeated in order to obtain the best placement, the number of continuous replacing and moving operations becomes large, and a processing time correspondingly becomes long. In particular, the larger the number of circuit blocks is, the larger the number of continuous replacing and moving operations becomes.

The inventor of the present application examined the cause of the above mentioned problems. A first problem is that the final placement state greatly depends upon the initial placement state. The cause for this first problem is considered that the circuit block replacement and movement is started from a given initial placement. A second problem is that the final placement state depends upon the number of continuous replacing and moving operations of the circuit blocks. The cause for this second problem is considered that if the number of continuous replacing and moving operations is set to a small value, an improvement processing ends before it reaches the best placement state, and the final placement state is apt to become a local minimum solution which minimizes the wiring length only locally, and on the other hand, if the number of continuous replacing and moving operations is set to a large value, the processing time becomes long. A third problem is that the larger the number of circuit blocks is, the larger the number of continuous replacing and moving operations becomes. The cause for this third problem is considered that, in order to obtain the best placement, if the circuit blocks are not replaced throughout, the final placement state is apt to become a local minimum solution which minimizes the wiring length only locally, and therefore, the number of continuous replacing and moving operations executed is apt to be made large.

SUMMARY OF THE INVENTION

Accordingly, it is an object of the present invention to provide an optimum placement method in a semiconductor integrated circuit, which has overcome the above mentioned defects of the conventional one.

Another object of the present invention is to provide an optimum placement method in a semiconductor integrated circuit, capable of obtaining a final placement which is not dependent upon a given initial placement and which never becomes the local minimum solution minimizing the wiring length only locally, and capable of minimizing the processing time even if the number of circuit blocks becomes large.

The above and other objects of the present invention are achieved in accordance with the present invention by an optimum placement method of circuit blocks in a semiconductor integrated circuit, comprising:

an initial placement determining process, based on connection information of circuit blocks, for preparing a new initial placement by placing circuit blocks in the form of a single stream of circuit blocks in which each circuit block is connected to only an adjacent circuit block but is not connected to a not-adjacent circuit block;

an inserting placement process for finding out, from the circuit blocks included in the new initial placement, a connection destination circuit block of a not-yet-placed circuit block which is not included in the new initial placement, and for inserting the not-yet-placed circuit block to a best position adjacent to the connection destination circuit block, thereby to temporarily determine the placement of all circuit blocks; and a local replacement process for replacing only the circuit blocks in the proximity of the inserted circuit blocks thereby to finally determine a best placement of all circuit blocks.

Specifically, the new initial placement is determined to include circuit blocks as many as possible with the total wiring length as short as possible. Alternatively, the new initial placement is determined by considering the order of weights given to connections between circuit blocks or weights given to wirings, or by evaluating the mixed degree of wirings and the number of wirings passing through a specific zone.

In a specific embodiment, before the new initial placement is determined, when there is satisfied a condition which is expected to increase an efficiency, to elevate an operation speed or to prevent a closed loop of an overall connection, a circuit block having only one connection destination circuit block is grouped with the only one connection destination circuit block, as one pseudo block, and the one pseudo block is treated as one circuit block in the initial placement determining process, and in the inserting placement process, and after the inserting placement process and before the local replacement process, the one pseudo block is returned to original circuit blocks.

The above and other objects, features and advantages of the present invention will be apparent from the following description of preferred embodiments of the invention with reference to the accompanying drawings.

DESCRIPTION OF THE PREFERRED EMBODIMENT

Figure 1:
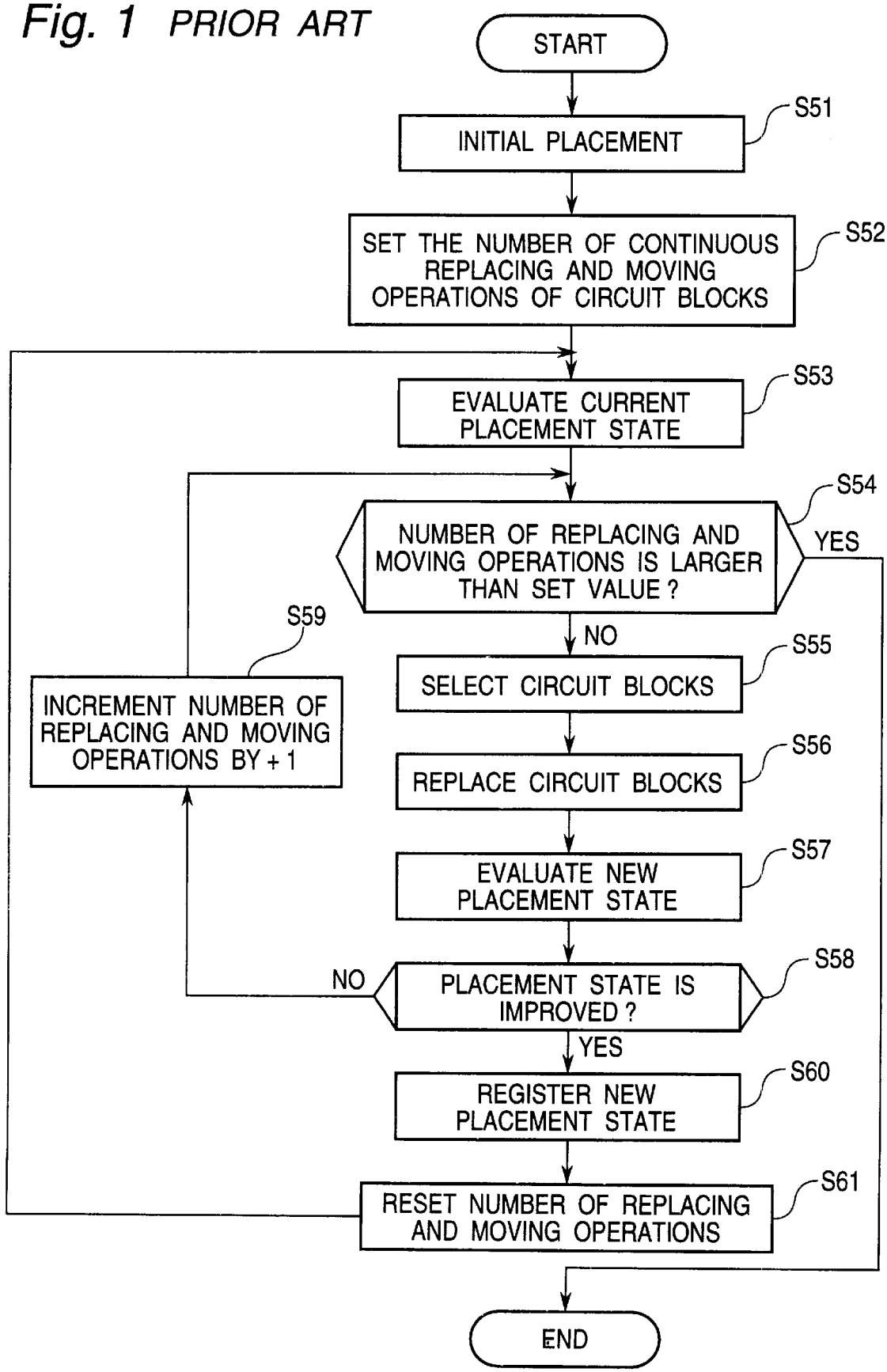
FIG. 1 is a flow chart illustrating one example of the prior art semiconductor integrated circuit placement method.
Figure 2A:
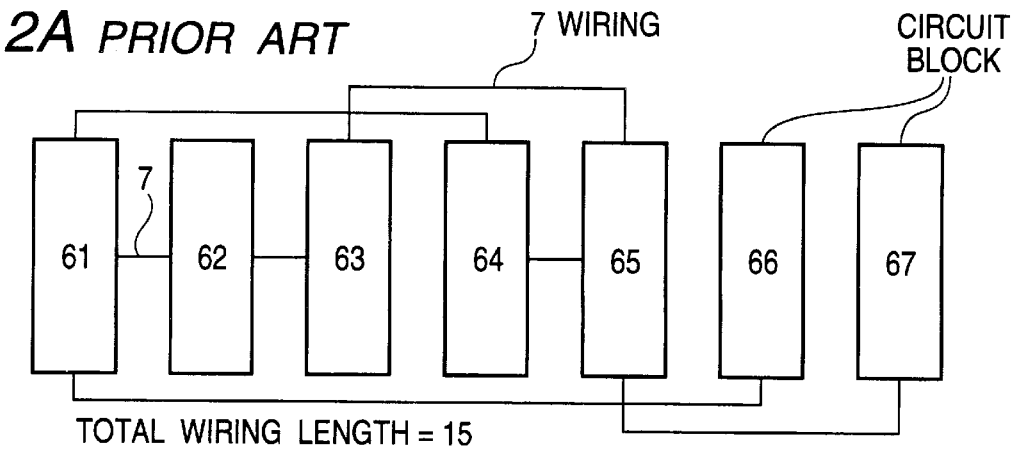
FIGS. 2A, 2B, 2C and 2D illustrate different placement states of seven circuit blocks.
Figure 2B:
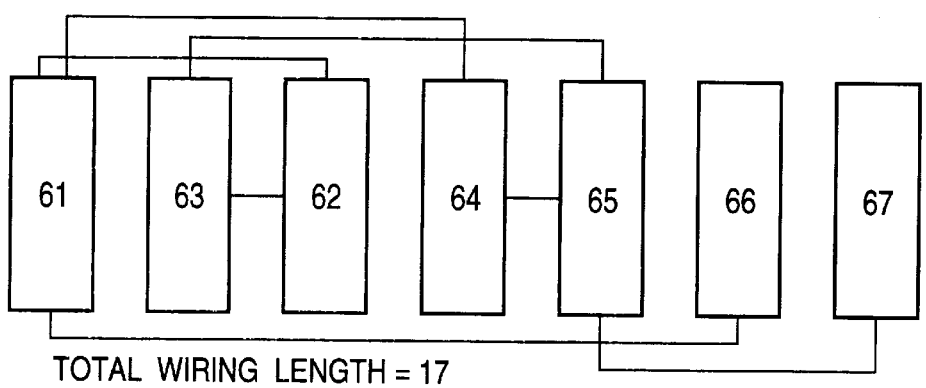
Figure 2C:
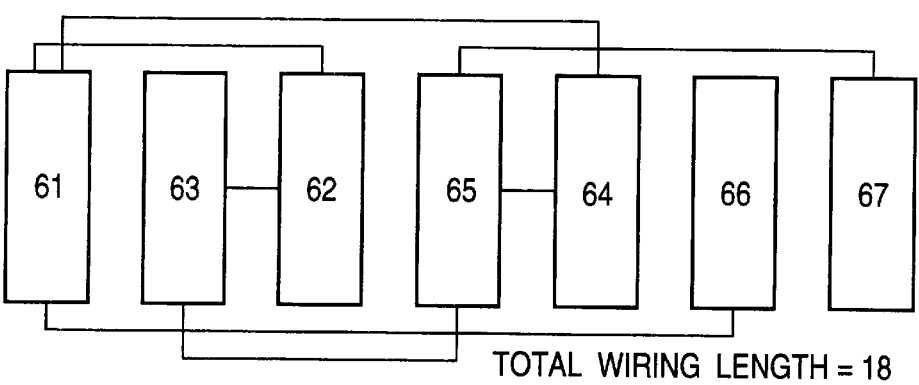
Figure 2D:
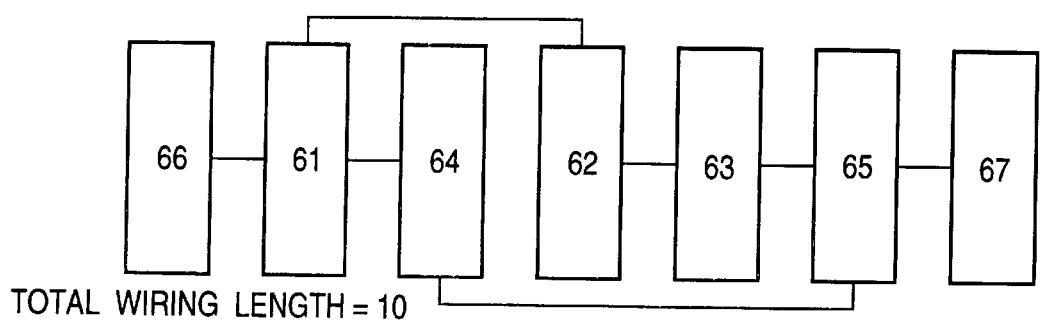
Figure 3:
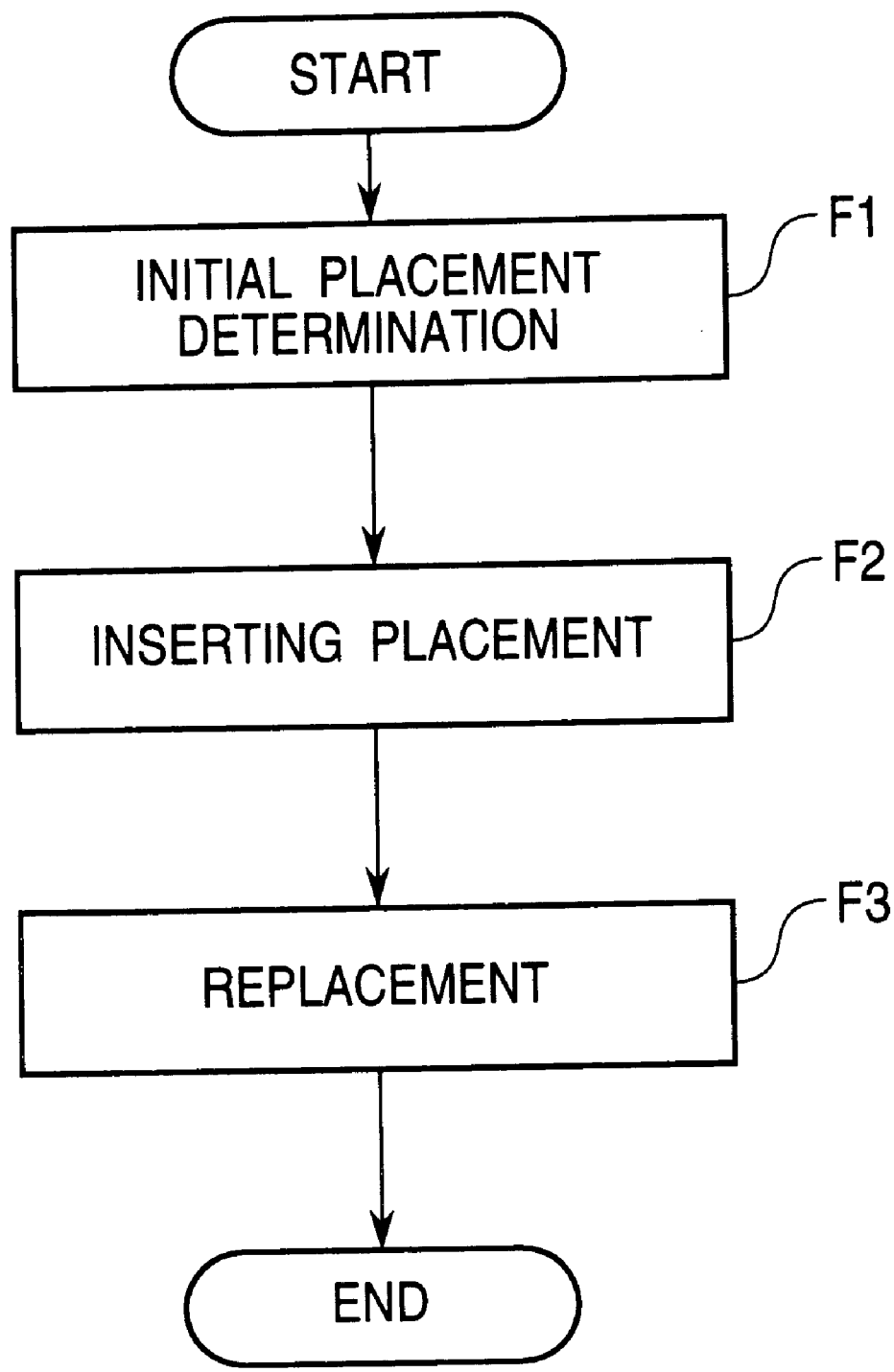
FIG. 3 is a flow chart illustrating one embodiment of the semiconductor integrated circuit placement method in accordance with the present invention.

Now, one embodiment of the semiconductor integrated circuit placement method in accordance with the present invention will be described. FIG. 3 is a flow chart illustrating the one embodiment of the semiconductor integrated circuit placement method in accordance with the present invention.

As seen from FIG. 3, the embodiment of the semiconductor integrated circuit placement method in accordance with the present invention includes three fundamental processes or flows, namely, an initial placement determining process or flow "F1" for preparing a new initial placement of circuit blocks by placing, on the basis of connection information of given circuit blocks, circuit blocks as many as possible, in the form of a single stream of circuit blocks having no feedback, in which each circuit block is connected to only adjacent circuit block but is not connected to a not-adjacent circuit block, an inserting placement process or flow "F2" for inserting each of the remaining or not-yet-placed circuit blocks which are not included in the new initial placement of circuit blocks, to a best position in the new initial placement, thereby to determine the placement of all the circuit blocks, and a local replacement process or flow "F3" for replacing only the circuit blocks in the proximity of the inserted circuit blocks thereby to minimize the total wiring length.

Figure 4:
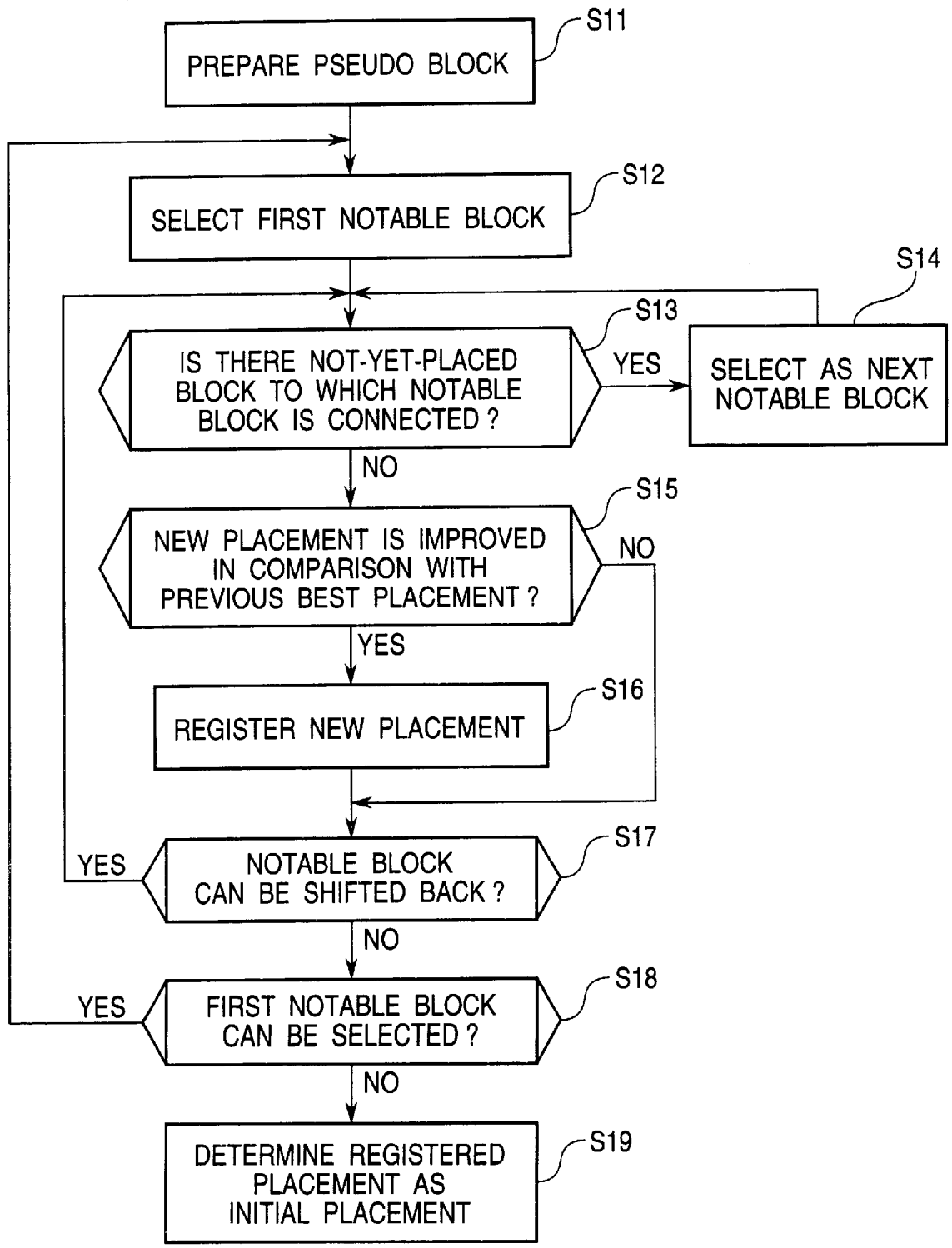
FIG. 4 is a detailed flow chart illustrating an initial placement determining process included in the semiconductor integrated circuit placement method as shown in FIG. 3.

Referring to FIG. 4, there is shown a detailed flow chart illustrating the initial placement determining process "F1" included in the semiconductor integrated circuit placement method as shown in FIG. 3.

In order to determine the new initial placement, preferably, when a certain condition is satisfied, for example, when there is satisfied a condition which is expected to increase an efficiency, to elevate an operation speed or to prevent a closed loop of an overall connection, a circuit block which has only one connection destination (namely, which is connected to only one circuit block) is grouped with the only one connection destination circuit block, as one pseudo block (Step S11). This pseudo block will be treated as one circuit block in this initial placement determining process "F1" and in the next inserting placement process "F2". This Step S11 can be omitted when the number of circuit blocks is relatively small, but when a large number of circuit blocks are included, the Step S11 is very effective in simplifying a succeeding processing.

A first notable circuit block which becomes a start circuit block in a possible single stream of circuit blocks, is selected (Step S12), and then, a search is conducted to find out a not-yet-placed circuit block to which the first notable circuit block is to be connected (Step S13). If a not-yet-placed circuit block to be connected is not found out, the processing goes into a Step S15. On the other hand, if a not-yet-placed circuit block is found out, the found-out circuit block is selected as a next notable circuit block, the step S13 is executed again (Step S14).

In the Step S15, a new placement state thus obtained is compared with a registered best placement state to evaluate the new placement state. If the new placement state is not the best, the processing goes into a Step S17. If the new placement state is the best, the new placement state is registered as the best placement state in place of the already register best placement state (Step S16). In the Stop S17, if the notable circuit block can be shifted back by one block, the processing returns to the Step S13. If the notable circuit block cannot be shifted back by one block, the processing goes into a Step S18. In the Step S18, if the first notable circuit block can be selected, the processing returns to the Step S12. If the first notable circuit block cannot be selected, the placement state registered as the best placement state at that time is determined as the new initial placement (Step S19). Thus, the new initial placement prepared in the initial placement determining process "F1" is composed of a single stream of circuit blocks having no feedback, in which each circuit block is connected to only an adjacent circuit block but is not connected to a not-adjacent circuit block. Therefore, there occurs circuit blocks which are included in giving circuit blocks (placed in a given order, namely, in a given circuit block placement) but which are not included in the new initial placement prepared in the initial placement determining process "F1".

These remaining or not-yet-placed circuit blocks which are not included in the new initial placement are inserted into the new initial placement in the next inserting placement process "F2".

Figure 5:
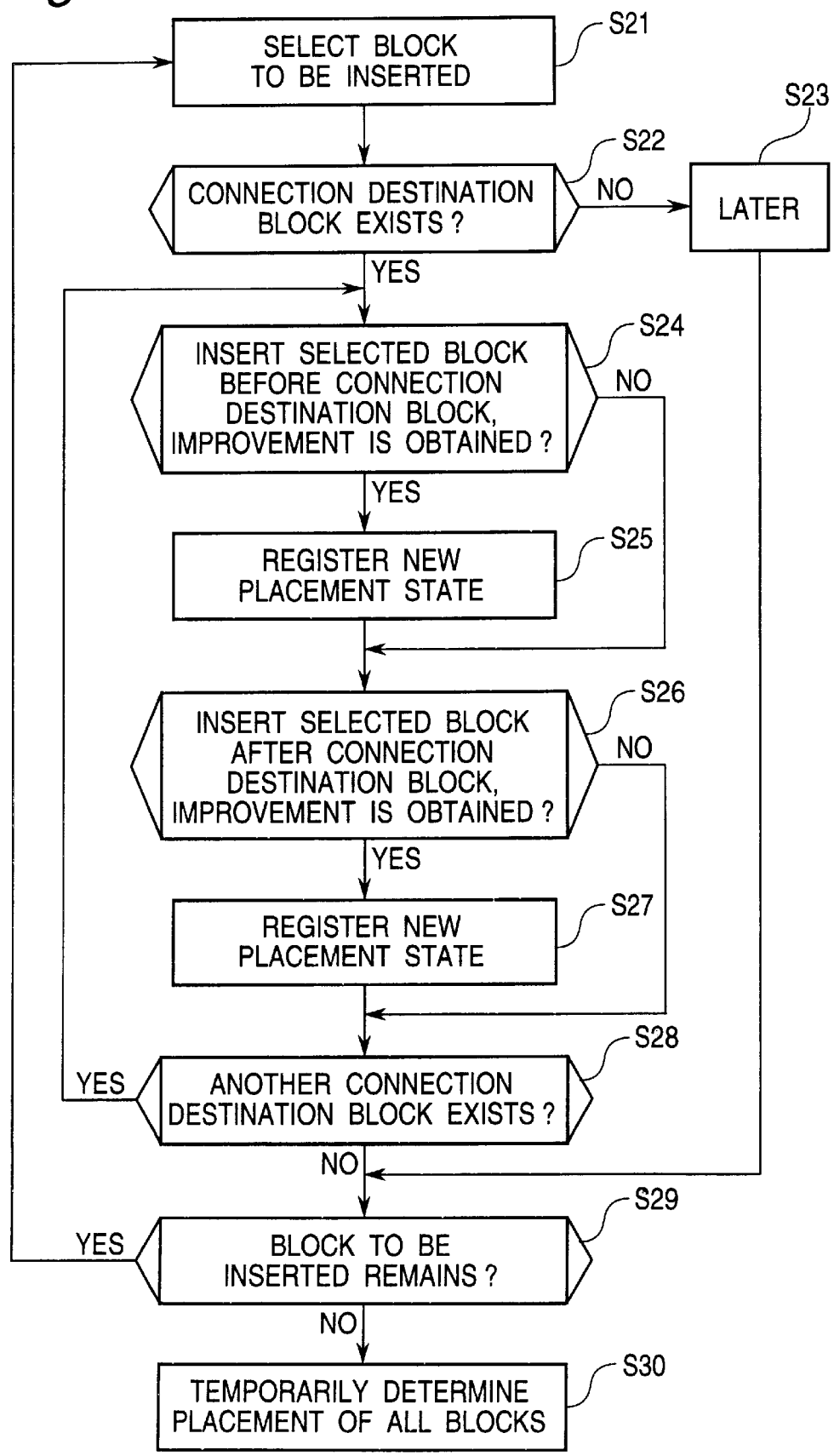
FIG. 5 is a detailed flow chart illustrating an inserting placement process included in the semiconductor integrated circuit placement method as shown in FIG. 3.

Referring to FIG. 5, there is shown a detailed flow chart illustrating an inserting placement process "F2" included in the semiconductor integrated circuit placement method as shown in FIG. 3.

First, from the remaining or not-yet-placed circuit blocks which are not included in the-new initial placement prepared in the initial placement determining process "F1", a "circuit block to be inserted" is selected (Step S21), and a search is conducted to find out, from the circuit blocks included in the new initial placement, a circuit block to which the selected "circuit block to be insed" is to be connected (Step S22). If the selected "circuit block to be inserted" does not have a connection destination, since the insertion of the selected "circuit block to be inserted" will be made later (Stop S23), the processing jumps to a Step S29.

If the selected "circuit block to be inserted" has a connection destination, namely, if there is found out a circuit block to which the selected "circuit block to be inserted" is to be connected is found out, the selected "circuit block to be inserted" is inserted just before the found-out connection destination circuit block, and a new block placement thus obtained is evaluated (Step S24). If the new block placement is not the best, the processing goes into a Stop S26. On the other hand, if the new block placement is the best, the new block placement is registered as the best placement state in place of the already register best placement state (Step S25).

In the Step S26, the selected "circuit block to be inserted" is inserted just after the same found-out connection destination circuit block, and a new block placement thus obtained is evaluated. If the new block placement is not the best, the processing goes into a Step S28. On the other hand, if the new block placement is the best, the new block placement is registered as the best placement state (Step S27), and thereafter, the processing goes into the Step S28.

In the Step S28, if the selected "circuit block to be inserted" has another connection destination, the processing returns to the Step S24. If the selected "circuit block to be inserted" does not have another connection destination, the processing goes into the Step S29. In the Step S29, if there remains a circuit block to be inserted, the processing returns to the Step S21. If there remains no circuit block to be inserted, the block placement registered as the best placement state at that time is temporarily determined as the best placement of all the circuit blocks (Step S30).

At this stage, when the pseudo block was prepared, the pseudo block is disassembled or returned to original discrete circuit blocks.

Figure 6:
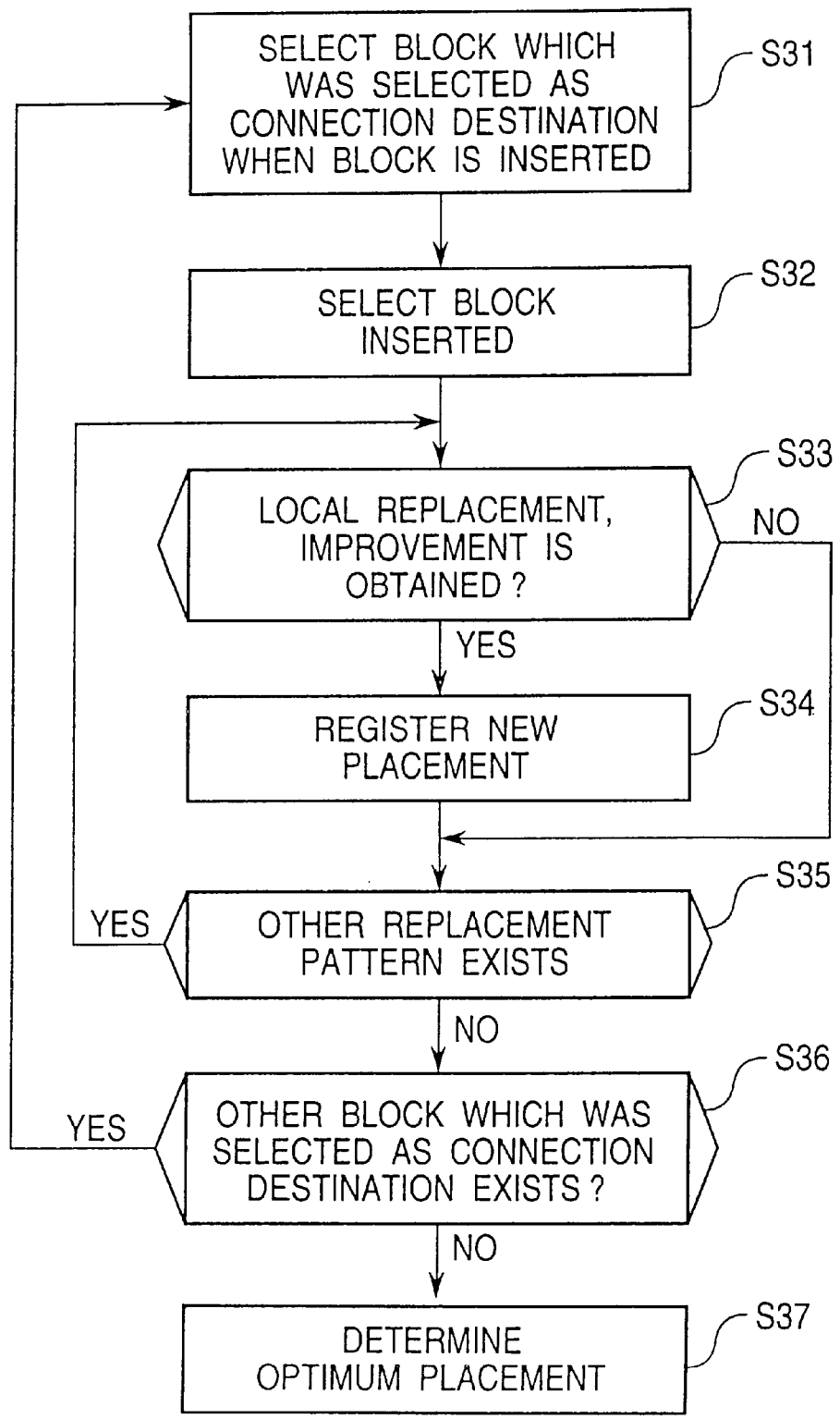
FIG. 6 is a detailed flow chart illustrating a local replacement process included in the semiconductor integrated circuit placement method as shown in FIG. 3.

Refering to FIG. 6, there is shown a detailed flow chart illustrating the local replacement process "F3" included in the semiconductor integrated circuit placement method as shown in FIG. 3.

The circuit block which was selected as the connection destination when the "circuit block to be inserted" was inserted, is selected (Step S31). If there are plurality of circuit blocks inserted in connection with the selected circuit block, the plurality of circuit blocks inserted are selected (Step S32). In a local zone or region including only the selected connection destination circuit block and the selected circuit block inserted or the selected plurality of circuit blocks inserted, a local replacement is conducted. A new block placement obtained as the result of the local replacement is evaluated (Step 533). If the new block placement is not the best, the processing goes into a Step S35. On the other hand, if the new block placement is the best, the new block placement is registered as the best placement state in place of the already registered best placement state (Step S34), and thereafter, the processing goes into the Step S35.

In the Step S35, whether or not another replacement pattern can be considered in the local replacement, is examined. If another replacement pattern can be considered, the processing returns to the Step S33. If another replacement pattern does not exist, the process goes into a Step S36. In the Step S36, whether or not there exists another circuit block which was selected as the connection destination, is examined. If another connection destination circuit block exits, the processing returns to the Step S31. If another connection destination circuit block does not exits, the new block placement registered as the best placement state at that time, is finally determined as an optimum block placement.

Now, a specific example of the optimum block placement determining process will be described with reference to FIGS. 4, 5 and 6 and also with reference to FIGS. 7A to 7H which illustrate different placement states of circuit blocks, performed in accordance with the semiconductor integrated circuit placement method of the present invention.

Figure 7A:
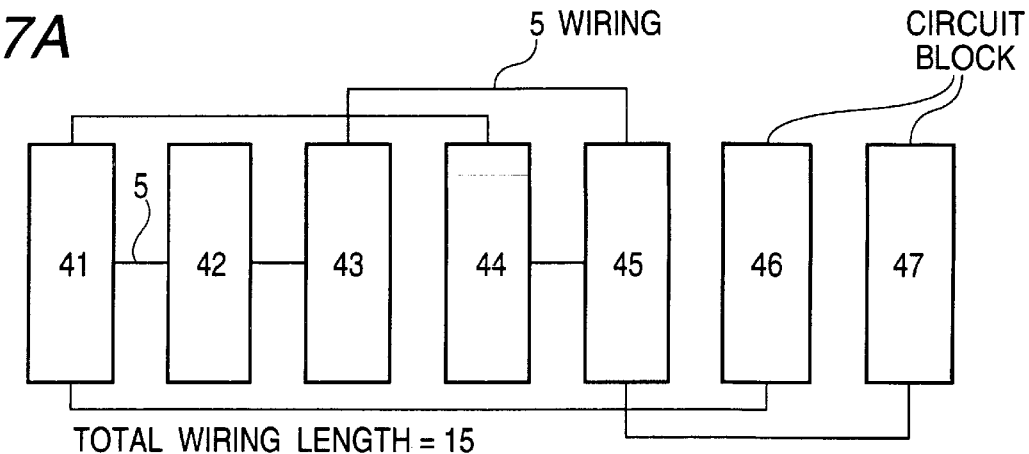
FIGS. 7A to 7H illustrate different placement states of circuit blocks, performed in the semiconductor integrated circuit placement method in accordance with the present invention.

FIG. 7A shows a given initial placement composed of seven circuit blocks 41, 42, 43, 44, 45, 46 and 47 placed in the named order, which are interconnected though wiring conductors 5 as shown. Here, assuming that a wiring length interconnecting between a pair of adjacent circuit blocks is "1" a total wiring length in the given initial placement shown in FIG. 7A becomes "15".

In the seven circuit blocks 41, 42, 43, 44, 45, 46 and 47 shown in FIG. 7A, the circuit blocks 41 and 46 and the circuit blocks 45 and 47 can be grouped as the pseudo block. In this example, however, assuming that these blocks do not satisfy the condition as mentioned hereinbefore, the circuit blocks 41 and 46 and the circuit blocks 45 and 47 are not grouped as the pseudo block (Step S11).

Next, the circuit block 41 is selected as a first notable block, and then, the search is conducted to find out a connection destination circuit block or blocks to which the selected circuit block 41 is to be connected. Since the circuit blocks 42, 44 and 46 are found out, the circuit block 44 is firstly selected as a next notable block (Steps S12, S13 and S14). Succeedingly, the circuit blocks 45 and 47 are selected in the named order as the notable block (Steps S13 and S14).

Figure 7B:
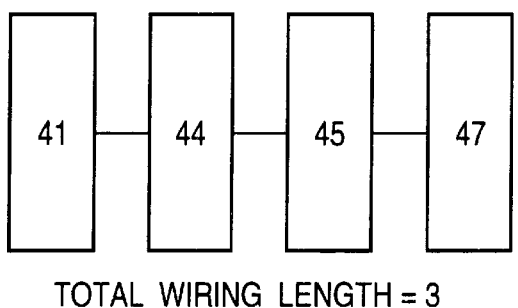

Here, since the connection destination circuit block no longer exists, a now circuit block placement state thus obtained is composed of four circuit blocks 41, 44, 45 and 47 placed in the named order, as shown in FIG. 7B. This new circuit block placement state is evaluated (Step S15). This evaluation can be conducted by using, for example, the number of the circuit blocks included and the total wiring length as a reference. First, the number of circuit blocks is compared, and then, the total wiring length is compared. It is preferable that the number of circuit blocks is large, and it is also preferable that the total wiring length is short.

Here, when the number of circuit blocks is firstly compared, since there is no comparison reference at an initial stage, the new placement state is registered as the best placement state (Step S16). Next, the notable circuit block is shifted back by one circuit block, namely, from the circuit block 47 to the circuit block 45, and the circuit block 45 is selected as the notable circuit block, again. Since this circuit block 45 is connected also to the circuit block 43, the circuit block 43 is selected as the notable block (Steps S17, S13 and S14). Then, the circuit block 42 is selected as the notable block (Steps S13 and S14).

Figure 7C:
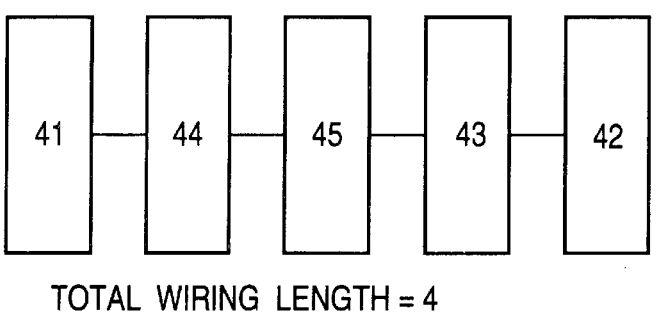

Here, since the connection destination circuit block no longer exists, a new circuit block placement state thus obtained is composed of five circuit blocks 41, 44, 45, 43 and 42, as shown in FIG. 7C. Since the already registered best placement state is composed of four circuit blocks, the new placement state composed of five circuit blocks is registered as the best placement state, in place of the already registered best placement state composed of four circuit blocks (Step S16).

Figure 7D:
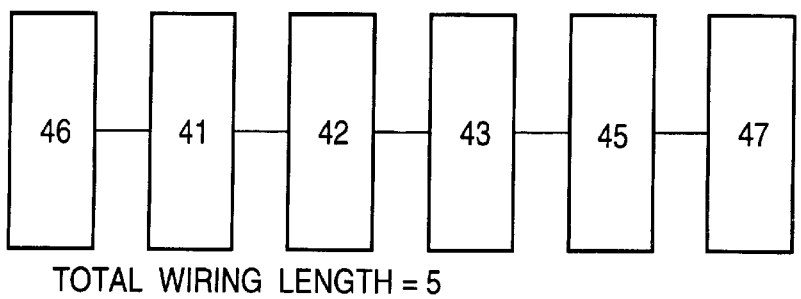

Finally, a block placement composed of six circuit blocks 46, 41, 42, 43, 45 and 47 placed in the named order as shown in FIG. 7D becomes the initial placement (Step S19).

As a "circuit block to be inserted" into the initial placement composed of six circuit blocks 46, 41, 42, 43, 45 and 47 placed in the named order as shown in FIG. 7D, the circuit block 44 is selected, and the search is conducted to find out a connection destination circuit block to which the circuit block 44 is to be connected. As a result, since the circuit blocks 41 and 45 are found out, the circuit block 41 is first selected as the connection destination circuit block (Steps S21 and S22).

Figure 7E:
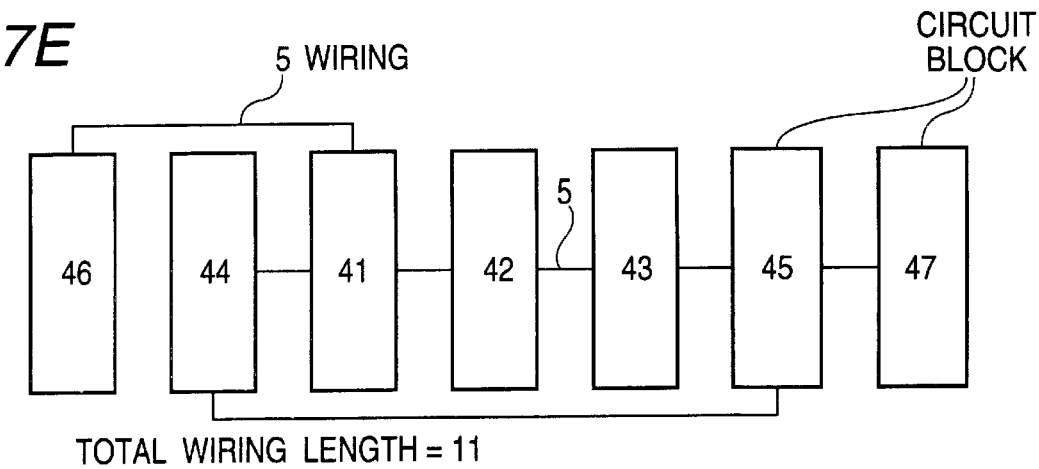

Next, the circuit block 44 is inserted before the connection destination circuit block 41. The new block placement thus obtained, which is composed of seven circuit blocks 46, 44, 41, 42, 43, 45 and 47 placed in the named order as shown in FIG. 7E, is evaluated (Step S24). Since this new block placement is composed of seven circuit blocks and has the total wiring length of "11", this new block placement as shown in FIG. 7F is registered as the best placement state, in place of the already registered best placement state composed of six circuit blocks (Step S25).

Figure 7F:
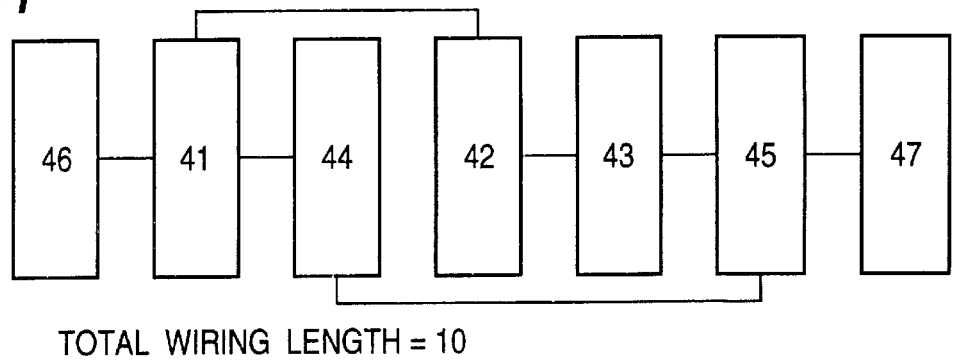

Furthermore, the circuit block 44 is inserted after the connection destination circuit block 41, and the new block placement thus obtained, which is composed of seven circuit blocks 46, 41, 44, 42, 43, 45 and 47 placed in the named order as shown in FIG. 7F, is evaluated (Step S26). Comparing this new block placement with the registered best placement state, both are the same in the number of circuit blocks included, but the total wiring length of the new block placement is "10" which is smaller than "11" of the total wiring length of the register best block placement Therefore, the new block placement composed of seven circuit blocks and has the total wiring length of "10" as shown in FIG. 7F is registered as the best placement state, in place of the already registered best placement state composed of seven circuit blocks and has the total wiring length of "11" as shown in FIG. 7E (Step S27).

Since the other connection destination circuit block 45 has been found out, the circuit block 45 is selected as the connection destination circuit block, and a processing similar to the above processing is conducted (Steps S28, S24 to S27).

After the placement of the circuit block 44 is determined, since in the shows example there is no circuit block to be inserted, the block placement composed of seven circuit blocks 46, 41, 44, 42, 43, 45 and 47 as shown in FIG. 7F, is temporarily determined as the optimum placement (Step S29 and S30).

Thereafter, from the seven circuit blocks 46, 41, 44, 42, 43, 45 and 47 included in the temporarily determined optimum placement as shown in FIG. 7F, there is selected the circuit block 41 which was selected as the connection destination when the block insertion was made, and then, there is selected the circuit block 44 which was inserted in connection with the selected circuit block 41. In a local zone or region including only the selected connection destination circuit block 41 and the selected circuit block 44 inserted, the local replacement is carried out (Steps S31, S32 and S33).

The new placement state thus obtained is compared with the already registered best placement state. In this example, however, since improvement is not obtained, and since another local replacement pattern does not exist, the block placement composed of seven circuit blocks 46, 41, 44, 42, 43, 45 and 47 as shown in FIG. 7F, is determined as the final optimum placement (Step S35, S36 and S37).

Figure 7G:
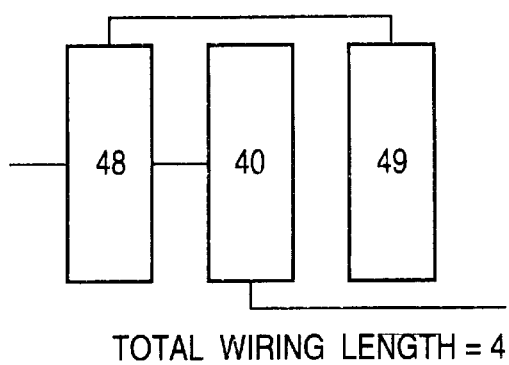
Figure 7H:
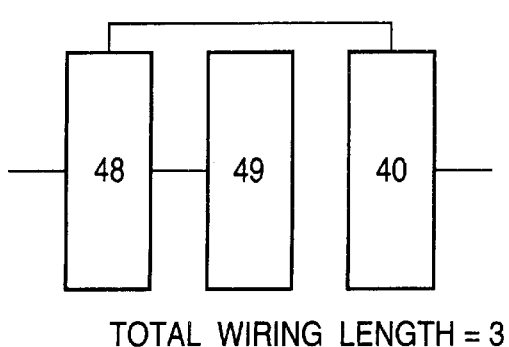

In this example, an effective local replacement cannot be obtained. Therefore, an example of an effective local replacement will be described with reference to FIGS. 7G and 7H. FIG. 7G illustrates that circuit blocks 49 and 40 are inserted in the named order to a circuit block 48. In this case, a local waste is generated. Therefore, there is selected the circuit block 48 which was selected as the connection destination when the block insertion was made, and then, there are selected the circuit blocks 49 and 40 which were inserted in connection with the selected circuit block 48. In a local zone or region including only the selected connection destination circuit block 48 and the selected circuit blocks 49 and 40 inserted, the local replacement is carried out (Steps S31, S32 and S33). As a result, an optimum placement composed of the circuit blocks 48, 49 and 40 placed in the named order as shown in FIG. 7H can be obtained (Steps S35, S36 and S37).

As seen from the above, if the circuit block placement is carried out in accordance with the method of the present invention, it is possible to generate an optimum placement state without coming under a local minimum solution which minimizes the wiring length only locally, dependently upon a given initial placement. Incidentally, in order to evaluate the circuit block placement, the number of circuit blocks included and the total wiring length have been examined in the above mentioned embodiment. However, it is possible to consider the order of weights given to connections between circuit blocks or weights given to wirings, or to evaluate the mixed degree of wirings and the number of wirings passing through a specific zone. In addition, in the case of the standard cell semiconductor integrated circuit, a total area of the chip may be evaluated.

As described above, the optimum placement method, in accordance with the present invention, of circuit blocks in a semiconductor integrated circuit, includes an initial placement determining process, an inserting placement process, and a local replacement process. In the initial placement determining process, a new initial placement is prepared on the basis of connection information of circuit blocks, by placing circuit blocks as many as possible, in the form of a single stream of circuit blocks in which each circuit block is connected to only an adjacent circuit block but is not connected to a not-adjacent circuit block. In the inserting placement process, from the circuit blocks included in the new initial placement, there is found out a connection destination circuit block of a not-yet-placed circuit block which is not included in the new initial placement, and then, the not-yet-placed circuit block is inserted to a best position adjacent to the found-out connection destination circuit block, thereby to temporarily determine the placement of all circuit blocks. In the local replacement process, only the circuit blocks in the proximity of the inserted circuit block(s) is replaced to finally determine the best placement of all circuit blocks.

As seen from the above, a given initial placement of circuit blocks is converted or transformed into the single stream of circuit blocks in which each circuit block is connected to only an adjacent circuit block but is not connected to a not-adjacent circuit block, and this single stream of circuit blocks is used as a new initial placement. Therefore, independently of the given initial placement of circuit blocks, it is possible to insert the not-yet-placed circuit block(s) which is not included in the new initial placement, between adjacent circuit blocks in the new initial placement, while taking the relation between circuit blocks into consideration, and thereafter, if necessary, it is possible to locally replace the circuit blocks in the proximity of the inserted circuit block. Thus, an optimum circuit block placement can be realized.

Accordingly, a first advantage of the circuit block optimum placement method in accordance with the present invention is that the final placement state is independent of the given initial placement, because the given initial placement is converted into a new initial placement compose of only the single stream of circuit blocks in which each circuit block is connected to only an adjacent circuit block but is not connected to a not-adjacent circuit block. A second advantage is that, since the not-yet-placed or remaining circuit block(s) which is not included in the new initial placement, is inserted between adjacent circuit blocks in the new initial placement, the placement of all circuit blocks can be completed with a small amount of computation while taking the relation between circuit blocks into consideration. The reason for this is that, since the not-yet-placed or remaining circuit block is inserted before or after only a connection destination circuit block of the not-yet-placed or remaining circuit block, it is sufficient if the replacement is made only in the inserted portion. A third advantage is that the total computation amount can be greatly reduced, because the replacement is made only in the proximity of the inserted block after the given initial placement has been converted into the single stream of circuit blocks and the remaining circuit blocks have been inserted into the single stream of circuit blocks.

The invention has thus been shown and described with reference to the specific embodiments. However, it should be noted that the present invention is in no way limited to the details of the illustrated structures but changes and modifications may be made within the scope of the appended claims.

I claim:

1. An optimum placement method of circuit blocks in a semiconductor integrated circuit, comprising:

an initial placement determining process, based on connection information of circuit blocks, for preparing a new initial placement by placing circuit blocks in the form of a single stream of circuit blocks in which each circuit block is connected to only an adjacent circuit block but is not connected to a not-adjacent circuit block;

an inserting placement process for finding out, from the circuit blocks included in said new initial placement, a connection destination circuit block of a not-yet-placed circuit block which is not included in said new initial placement, and for inserting said not-yet-placed circuit block to a best position adjacent to said connection destination circuit block thereby to temporarily determine the placement of all circuit blocks; and a local replacement process for replacing only die circuit blocks in the proximity of the inserted circuit blocks thereby to finally determine a best placement of all circuit blocks.

2. A method claimed in claim 1 wherein said new initial placement is determined to include circuit blocks as many as possible with the total wiring length as short as possible.

3. A method claimed in claim 1 wherein said new initial placement is determined by considering the order of weights given to connections between circuit blocks or weights given to wirings, or by evaluating the mixed degree of wirings and the number of wirings passing through a specific zone.

4. A method claimed in claim 1 wherein, before said new initial placement is determined, when there is satisfied a condition which is expected to increase an efficiency, to elevate an operation speed or to prevent a closed loop of an overall connection, a circuit block having only one connection destination circuit block is grouped with the only one connection destination circuit block, as one pseudo block, and said one pseudo block is treated as one circuit block in said initial placement determining process and in said inserting placement process, and after said inserting placement process and before said local replacement process, said one pseudo block is returned to original circuit blocks.

* * * * *